(12) United States Patent
Banerjee et al.

(10) Patent No.: US 12,183,815 B2
(45) Date of Patent: Dec. 31, 2024

(54) NON-LINEAR HEMT DEVICES

(71) Applicant: SEMICONDUCTOR COMPONENTS INDUSTRIES, LLC, Phoenix, AZ (US)

(72) Inventors: Abhishek Banerjee, Kruibeke (BE); Peter Moens, Erwetegem (BE); Herbert De Vleeschouwer, Zulte (BE); Peter Coppens, Kanegem (BE)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 1027 days.

(21) Appl. No.: 17/143,301

(22) Filed: Jan. 7, 2021

(65) Prior Publication Data

US 2022/0216332 A1    Jul. 7, 2022

(51) Int. Cl.
   *H01L 29/778* (2006.01)
   *H01L 29/20* (2006.01)
   *H01L 29/423* (2006.01)

(52) U.S. Cl.
   CPC ...... *H01L 29/7786* (2013.01); *H01L 29/2003* (2013.01); *H01L 29/42356* (2013.01); *H01L 29/7787* (2013.01)

(58) Field of Classification Search
   None
   See application file for complete search history.

(56) References Cited

U.S. PATENT DOCUMENTS

| | | |
|---|---|---|
| 2005/0093019 A1 | 5/2005 | Kato |
| 2005/0139891 A1 | 6/2005 | Beach et al. |
| 2011/0186858 A1 | 8/2011 | Roberts et al. |
| 2012/0225526 A1 | 9/2012 | Hersee et al. |
| 2016/0111501 A1* | 4/2016 | Chen ................ H01L 23/3171 257/192 |
| 2020/0091332 A1* | 3/2020 | Hata ................ H01L 29/802 |

FOREIGN PATENT DOCUMENTS

EP    2426712 A1    3/2012

OTHER PUBLICATIONS

Semiconductor Today, "Panasonic Unveils GaN Power Transistor with 10kV Breakdwn Voltage," http://www.semiconductor-today.com/news_items/NEWS_2007/DEC_07/PANASONIC_141207.htm, Dec. 14, 2007.
Tohru Oka, "Recent Development of Vertical GaN Power Devices," Japanese Journal of Applied Physics 58, SB0805, Apr. 1, 2019.
Zhongda Li et al., "Isolation Methods for GaN Lateral MOS-Channel HEMTS," 2012.
Yu-Syuan Lin et al., "Contact Engineering GaN-on-Silicon Power Devices for Breakdown Voltage Enhancement," 2013.
Yuyin Xi et al., "Effect of 5 MeV Proton Radiation on DC Performance and Reliability of Circular-Shaped AlGaN/GaN High Electron Mobility Transistors," 2013.
Turar Baltynov et al., "The World's First High Voltage GaN-on-Diamond Power Devices," 2014.

* cited by examiner

*Primary Examiner* — Grant S Withers

(74) *Attorney, Agent, or Firm* — Brake Hughes Bellermann LLP

(57) ABSTRACT

High Electron Mobility Transistors (HEMTs) are described with a circular gate, with a drain region disposed within the circular gates and circular source region disposed around the circular gates. The circular gate and the circular source region may form complete circles.

25 Claims, 17 Drawing Sheets

Form IMD, second metallization layer, and associated via connections — 1100

For, IMD and form drain contact lines, source contact lines, and gate contact at third metallization layer, with via connection — 1203

From IMD and form drain bondpad, source bondpad, and gate bondpad at fourth metallization layer, with via connections — 1201

Active area
1302

Active area
1402

Active area
1502

NON-LINEAR HEMT DEVICES

TECHNICAL FIELD

This description relates to High Electron Mobility Transistors (HEMTs).

BACKGROUND

A HEMT is a type of transistor that utilizes a current channel formed using a heterojunction at a boundary between two materials having different band gaps. For example, a relatively wide band gap material such as AlGaN (Aluminum Gallium Nitride) may be doped with n-type impurities and used to form a junction with an undoped, relatively narrow band gap material, such as GaN (Gallium Nitride). Then, an equilibrium is reached in which the narrow band gap material has excess majority carriers that form a 2-dimensional electron gas (2DEG). Consequently, and because the narrow band gap material has no doping impurities to disrupt current flow through scattering, HEMT devices provide, among other advantages, very high switching speeds, high gains, and high power applications.

SUMMARY

According to one general aspect, a High Electron Mobility Transistor (HEMT) device may include a drain, a circular gate around the drain, a source around the circular gate, and a drain contact connected to the drain with a drain via connection through at least one dielectric layer. The HEMT device may include a source contact connected to the source with a source via connection through the at least one dielectric layer, and a gate contact connected to the circular gate with a gate via connection through the at least one dielectric layer.

According to another general aspect, a High Electron Mobility Transistor (HEMT) device may include a first drain, a first circular gate around the first drain, a second drain, and a second circular gate around the second drain and connected to the first gate, and to a gate pad. The HEMT device may include a source around the first circular gate and the second circular gate. The HEMT device may include a drain runner connected to the first drain with a first drain via connection through at least one dielectric layer, and connected to the second drain with a second drain via connection through the at least one dielectric layer, a source runner connected to the source with a first source via connection and a second source via connection through the at least one dielectric layer, and a gate contact connected to the gate pad with at least one gate via connection through the at least one dielectric layer.

According to another general aspect, a method of making a High Electron Mobility Transistor (HEMT) may include forming a circular gate around a drain, the circular gate including a pGaN layer with a gate metal disposed thereon, forming a drain contact to the drain, and forming a source contact to a source that is around the circular gate. The method may include forming at least one dielectric layer on the circular gate, the drain contact, and the source contact, forming a drain via connection to the drain contact through the at least one dielectric layer, forming a source via connection to the source contact through the at least one dielectric layer, and forming a gate via connection to the gate through the at least one dielectric layer.

According to another general aspect, a High Electron Mobility Transistor (HEMT) device may include a plurality of connected, partial-circle gates, a plurality of drains, of which a drain is disposed within each of the partial-circle gates, and a plurality of connected, partial-circle sources disposed along the plurality of connected, partial-circle gates. The HEMT device may include a drain metal connecting each of the plurality of drains to one another, a gate metal connected to the plurality of connected, partial-circle gates, and a source metal connected to the plurality of connected, partial-circle sources.

The details of one or more implementations are set forth in the accompanying drawings and the description below. Other features will be apparent from the description and drawings, and from the claims.

DETAILED DESCRIPTION

As described in detail below, embodiments include a HEMT that provides high reliability operation, including desired pinch-off characteristics of a current channel, even when a high drain voltage is present. In example embodiments, natural device isolation of individual (or groups of) HEMT devices may be provided, which may reduce or eliminate difficulties associated with conventional isolation techniques. Reductions in device size and/or reductions in on-resistance may be obtained, as well as improved thermal dissipation characteristics. Described device structures and characteristics may be used across many different types of HEMT devices and associated processing techniques.

In example implementations, shown by way of example in FIGS. 1-16, a HEMT may be provided with a drain region included within a circular gate region, which is itself provided within a source region. Contacts to the drain, gate, and source are provided using a three-dimensional structure with corresponding drain, gate, and source via connections. Accordingly, it is possible to make a gate-source connection without breaking either the gate or source circle, thereby avoiding off-state electric fields that may occur due to edge effects and/or point effects, and that reduce a reliability of conventional devices. Such example implementations may be suited for high power applications.

In other example implementations, shown by way of example in FIGS. 17-26, half-circular gate regions may be implemented with drain regions within the half-circular gate regions, and a source region outside the half-circular gate regions. Such example implementations may be used, for example, in lower-power, high-frequency switching operations.

Figure 1:
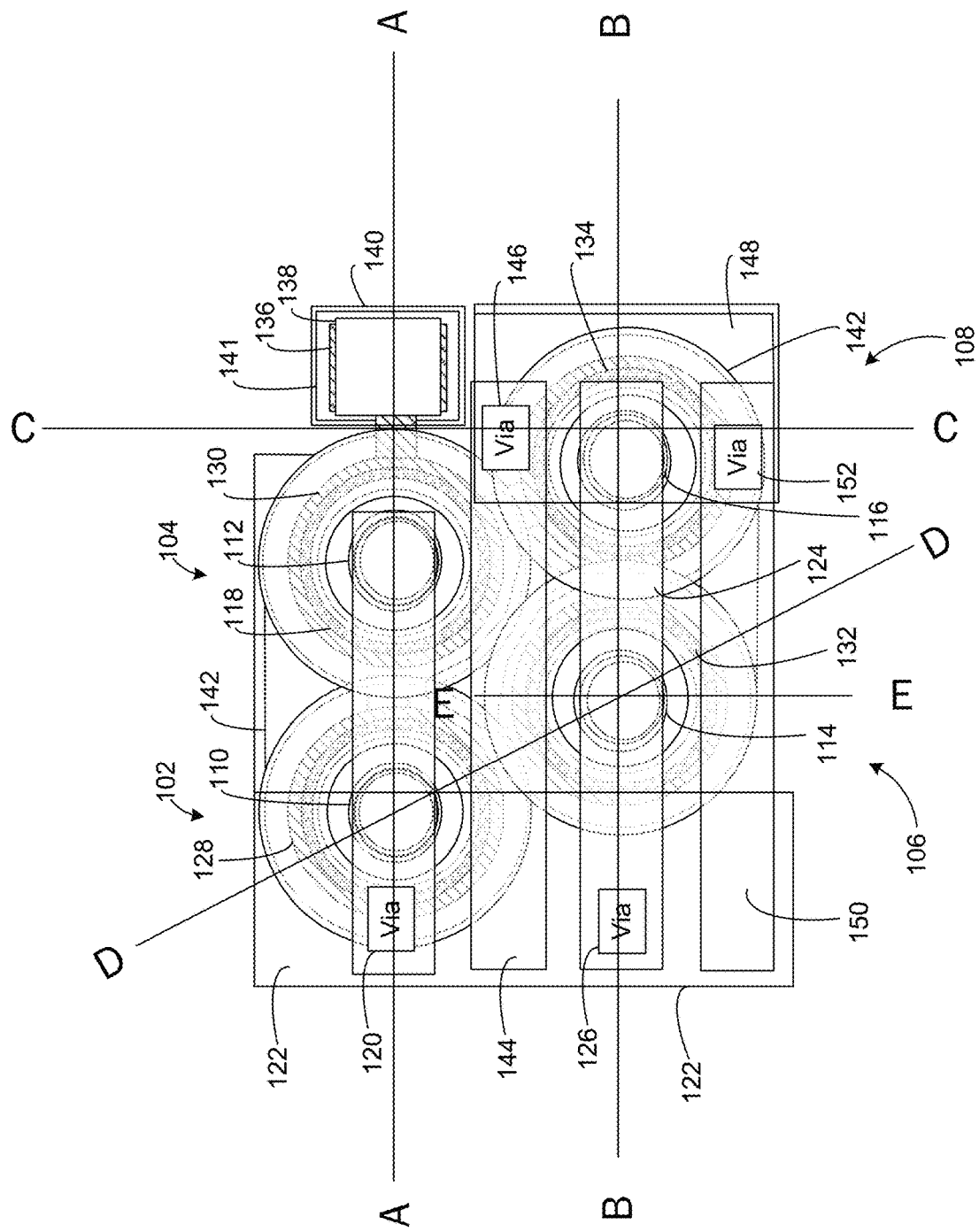
FIG. 1 is a top view of an example implementation of a three-dimensional HEMT device with circular HEMT cells.

FIG. 1 is a top view of an example implementation of a three-dimensional HEMT device with circular HEMT cells. FIG. 1 illustrates a first HEMT cell 102, a second HEMT cell 104, a third HEMT cell 106, and a fourth HEMT cell 108. Although FIG. 1 illustrates the four HEMT cells 102, 104, 106, 108, it will be appreciated that various implementations may have a single HEMT cell, or may have more than four HEMT cells (e.g., 6 HEMT cells, or 8 HEMT cells, or more).

In the example of FIG. 1, the HEMT cell 102 includes a drain 110, while the HEMT cell 104 includes a drain 112, the HEMT cell 106 includes a drain 114, and the HEMT cell 108 includes a drain 116. As described and illustrated in detail, below, the drains 110, 112, 114, 116 each represent a three-dimensional drain that includes various metal contact layers and field plates, as well as drain regions within an underlying HEMT barrier layer (e.g., AlGaN barrier layer), which are not visible, or not fully visible, in the top view of FIG. 1.

A first drain runner 120 is connected by via connection (not visible in FIG. 1) to the drains 110, 112. A via connection 120 connects the first drain runner 120 to a drain bondpad 122. Similarly, a second drain runner 124 connects the drains 114, 116, by way of a via connection 126, to the drain bondpad 122. In the present description, via connections connecting drain contacts may be referred to as drain via connections.

Further in the example of FIG. 1, the HEMT cell 102 includes a gate ring 128, while the HEMT cell 104 includes a gate ring 130, the HEMT cell 106 includes a gate ring 132, and the HEMT cell 108 includes a gate ring 134. As described and illustrated in detail, below, the gate rings 128, 130, 132, and 134 each represent a three-dimensional, common gate connection that includes various metal contact layers, field plates, and gate regions on an underlying HEMT barrier layer (e.g., AlGaN barrier layer), which are not visible, or not fully visible, in the top view of FIG. 1.

As shown, all of the gate rings 128, 130, 132, and 134 are connected to one another, and to a common gate connection 136. The common gate connection is connected by via connection (not shown in FIG. 1) to a gate metal 138 (and associated gate field plates, not visible in FIG. 1), which is connected by another via connection (also not shown in FIG. 1) to a gate contact 140 and thereby by another via connection (also not shown in FIG. 1) to a gate bondpad 141. In the present description, via connections connecting gate contacts may be referred to as gate via connections.

Each of the HEMT cells 102, 104, 106, 108 shares a common source 142 that extends around and between the HEMT cells 102, 104, 106, and 108. As with the drains 110, 112, 114, and 116, and the gate rings 128, 130, 132, and 134, the common source 142 may include various metal contact layers and field plates, as well as source regions within an underlying HEMT barrier layer (e.g., AlGaN barrier layer), which are not visible, or not fully visible, in the top view of FIG. 1.

A first source runner 144 is connected by via connection (not visible in FIG. 1) to the source 142. A via connection 146 connects the first source runner 144 to a source bondpad 148. Similarly, a second source runner 150 connects the source 142, by way of a via connection 152, to the source bondpad 148. In the present description, via connections connecting source contacts may be referred to as source via connections.

In FIG. 1, the circular gates or gate rings of the HEMT cells 102, 104, 106, 108 are illustrated as complete circles. As described, it is feasible to utilize such complete circles by virtue of the fact that the source, gate, and drain connections may be made in three dimensions, using the describe via connections. In this way, it is possible to avoid point and edge field effects that may otherwise occur if an incomplete circle is utilized.

Figure 2:
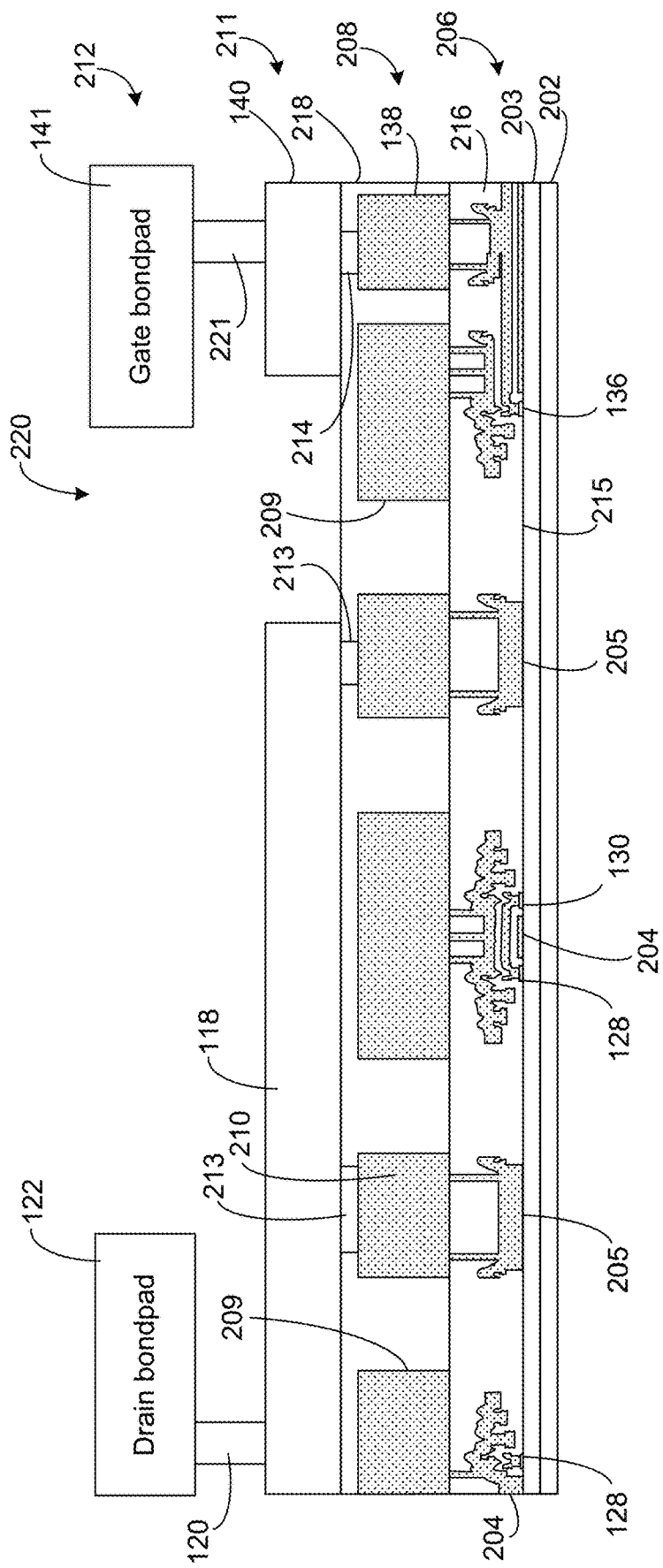
FIG. 2 is a cross-sectional view of FIG. 1, taken along line AA.

FIG. 2 is a cross-sectional view of FIG. 1, taken along line AA. In FIG. 2, a channel layer 202 (e.g., GaN) and a barrier layer 203 (e.g., AlGaN) are illustrated. Ohmic source connections 204 and Ohmic drain connections 205 are illustrated, with Ohmic metals being connected to a first metal layer 206 (which may be referred to as M1), the first metal layer 206 including source/drain/gate field plates, as shown. Via connections 207 connect the first metal layer 206 to a second metal layer 208, which includes source contacts 209 and drain contacts 210.

A third metal layer 211 includes the drain runner 118 and the gate contact 140. A fourth metal layer 212 includes the drain bondpad 122 and the gate bondpad 141. As shown, via connections 213 connect the drain contacts 210 to the drain runner 118, while a via connection 214 connects the gate contact 138 to the gate contact 140. Similarly, the via connection 120 of FIG. 1 connects the drain runner 118 to the drain bondpad 122, as already described, while a via connection 221 connects the gate contact 140 to the gate bondpad 141.

A passivation layer 215 is disposed on the barrier layer 203 where Ohmic contacts are not required. A first inter-metal dielectric (IMD) 216 is provided, through which via connections 207 are established. A second intermetal dielectric 218 is disposed around the contacts 209, 210, 138 of the second metal layer 208, through which the via connections 213 and 214 are formed. A final intermetal dielectric layer 220 is disposed between and around the drain runner 118, the gate contact 140, the drain bondpad 122, and the gate bondpad 141d, through which the via connections 120 and 221 are formed.

Figure 3:
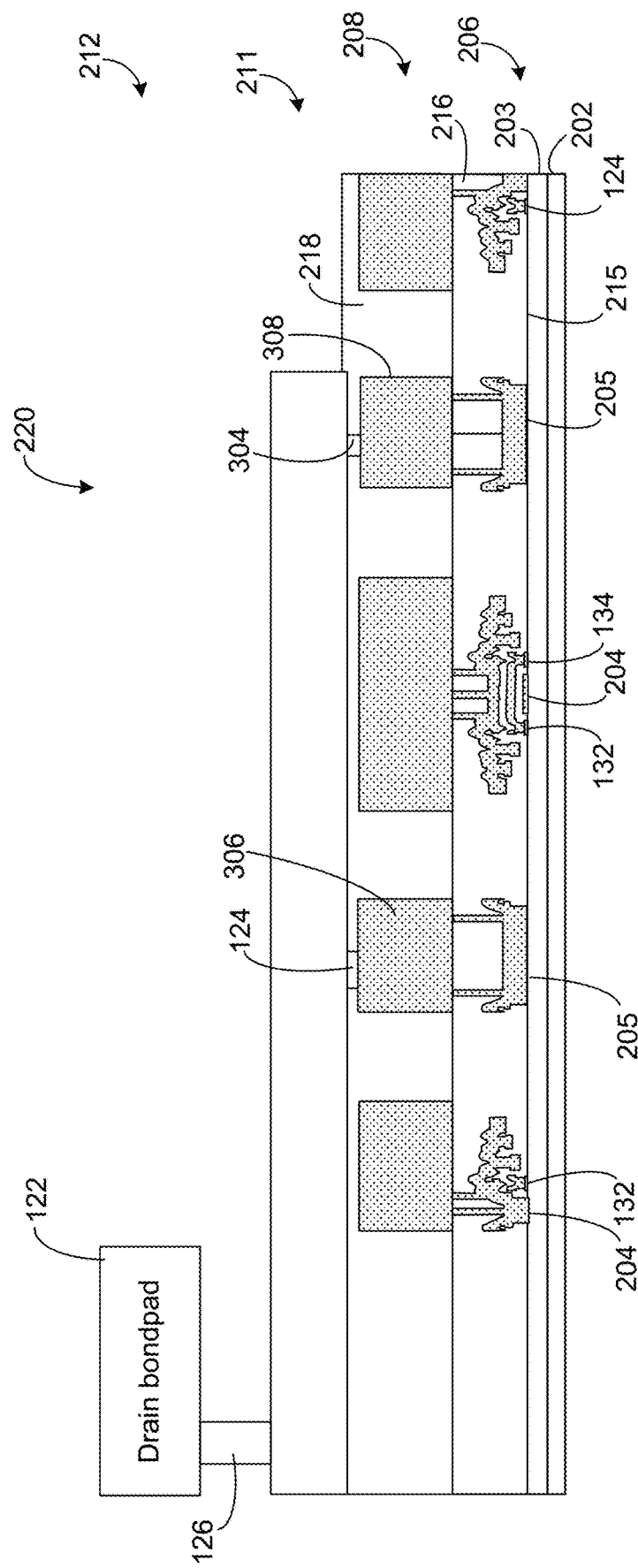
FIG. 3 is a cross-sectional view of FIG. 1, taken along line BB.
Figure 4:
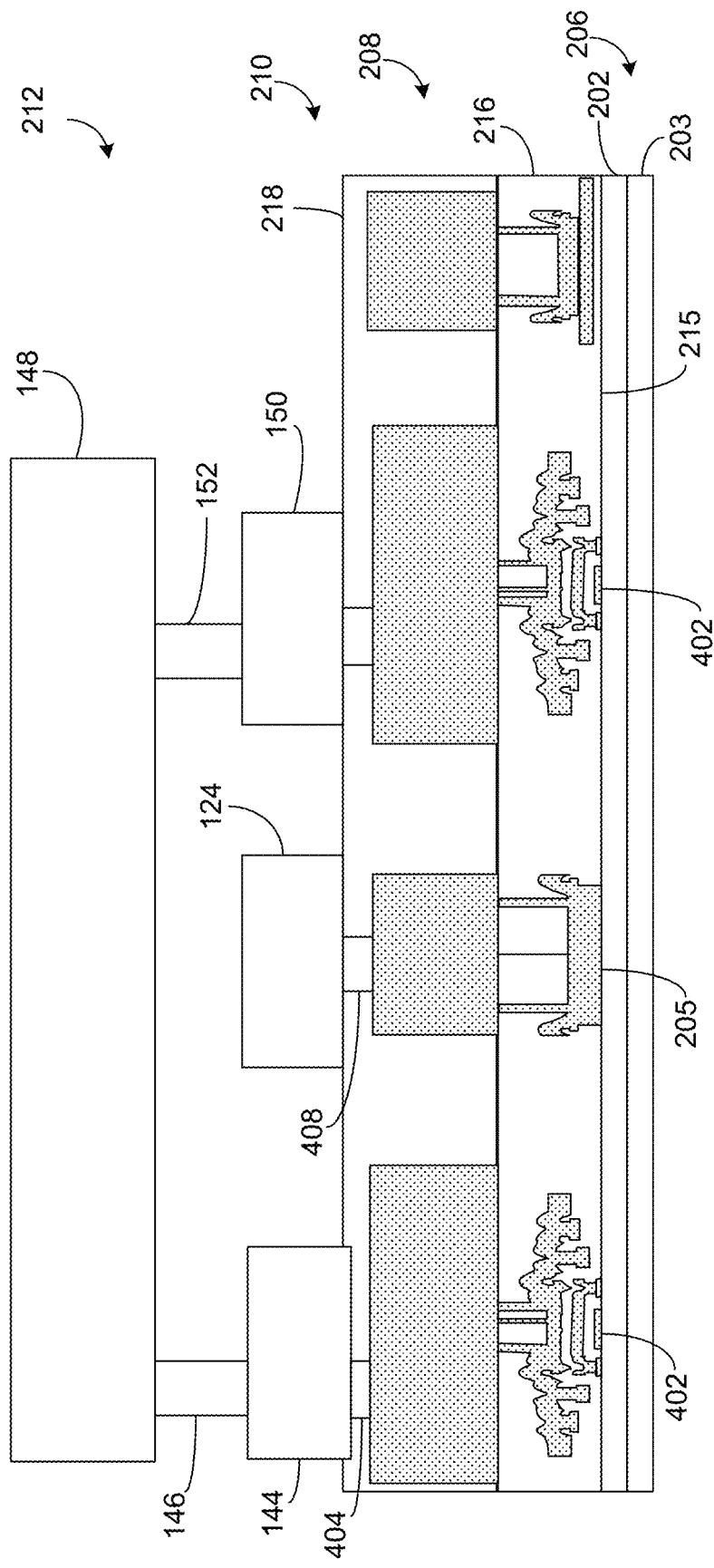
FIG. 4 is a cross-sectional view of FIG. 1, taken along line CC.
Figure 5:
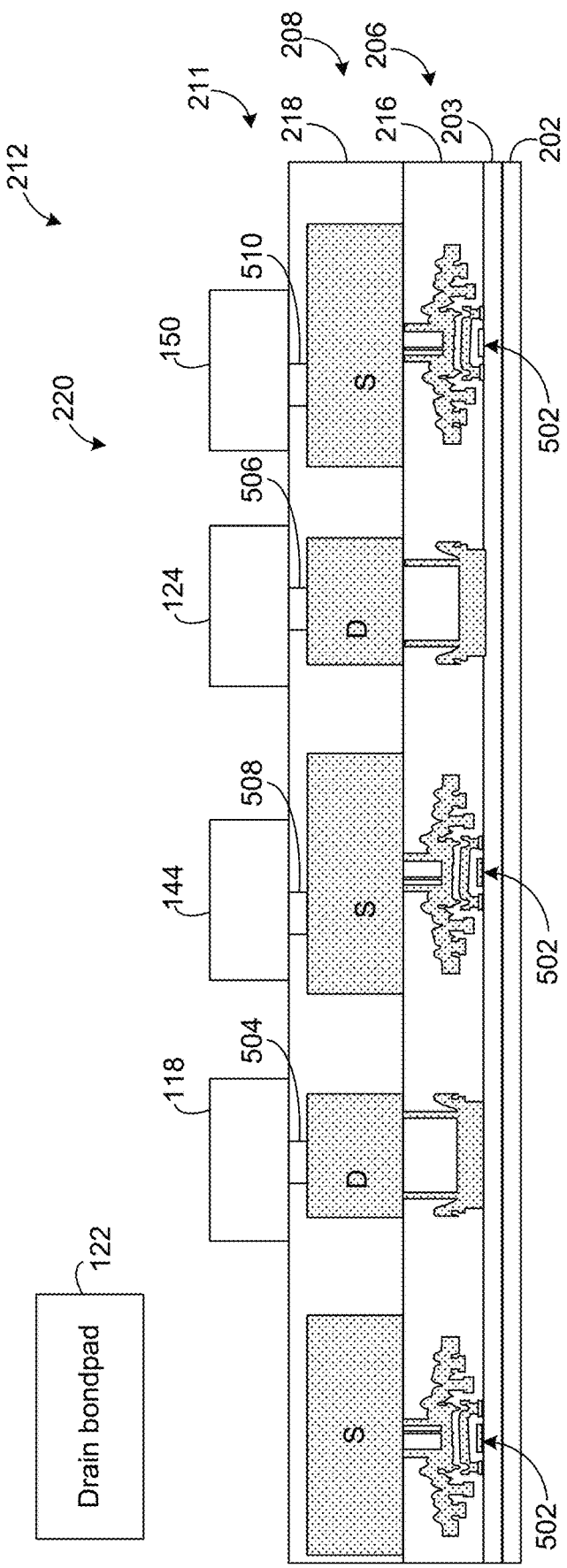
FIG. 5 is a cross-sectional view of FIG. 1, taken along line DD.
Figure 6:
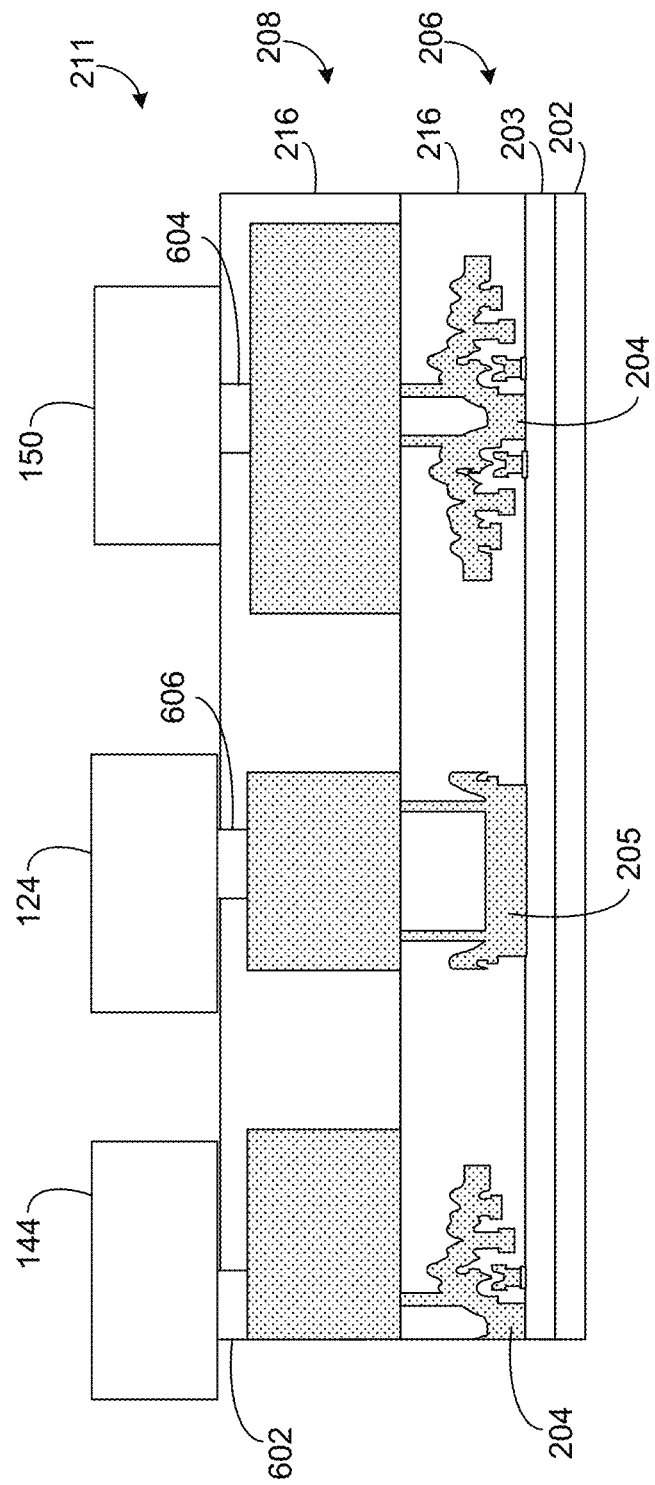
FIG. 6 is a cross-sectional view of FIG. 1, taken along line EE.

FIG. 3 is a cross-sectional view of FIG. 1, taken along line BB. FIG. 4 is a cross-sectional view of FIG. 1, taken along line CC. FIG. 5 is a cross-sectional view of FIG. 1, taken along line DD. FIG. 6 is a cross-sectional view of FIG. 1, taken along line EE. In FIGS. 3-6, structural details of connections of ohmic contacts 204, 205, and of metal layers 206, 208, 211, 212, are similar to that of FIG. 2, and are not specifically enumerated unless such enumeration is helpful in illustrating structural details of the top view of FIG. 1 that are not visible in FIG. 1.

In FIG. 3, via connection 302 and via connection 304 are illustrated as connecting drain contact 306 and drain contact 308, respectively, to the drain runner 124. In FIG. 4, Ohmic source contacts 402 are illustrated in cross-section, but should be understood to connect in a third or z dimension to corresponding source contacts of the metal layer 208. Via connection 404 and via connection 406 connect the source runner 144 and the source runner 150, respectively, to corresponding source contacts of the metal layer 208.

In FIG. 5, as in FIG. 4, Ohmic source contacts 502 are illustrated in cross-section, but should be understood to connect in a third or z dimension to corresponding source contacts of the metal layer 208. Also in FIG. 5, via connection 504 and via connection 506 connect the drain runner 118 and the drain runner 124, respectively, to corresponding drain contacts within the metal layer 208. Similarly, a via connection 508 and a via connection 510 connect the source runner 144 and the source runner 150, respectively, to corresponding source contacts within the metal layer 208. In FIG. 6, similarly, via connection 602 and via connection 604 connect the source runner 144 and the source runner 150, respectively, to corresponding source contacts within the metal layer 208. Similarly, a via connection 606 connects the drain runner 124 to a corresponding drain contact within the metal layer 208.

Figure 7:
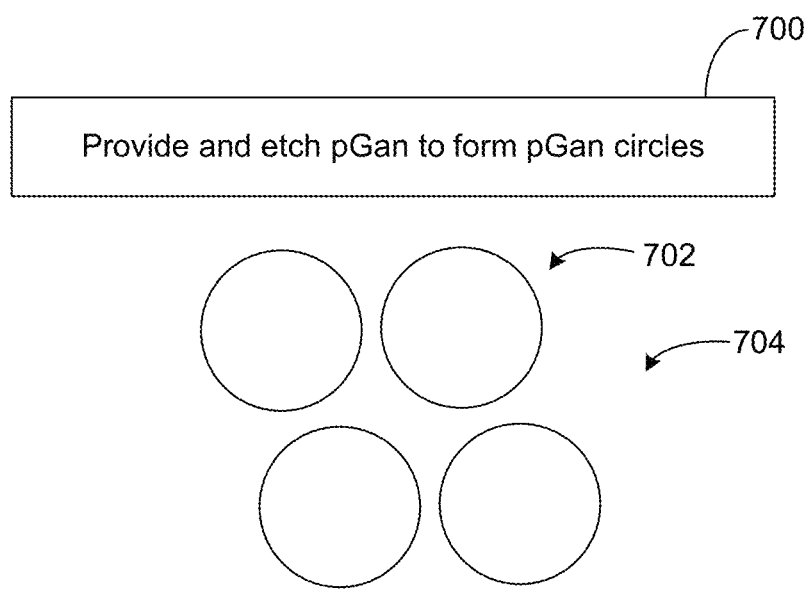
FIG. 7 is a top view of a first example process step for making the HEMT device of FIG. 1.

FIG. 7 is a top view of a first example process step for making the HEMT device of FIG. 1. In FIG. 7, it is assumed that channel layer 202, barrier layer 203, and other suitable HEMT structures are provided within a substrate 704, but are not separately illustrated in FIG. 7. In FIG. 7, pGan circles 702 are formed by providing a layer of pGan on the substrate 704, and then etching the pGan, e.g., using a suitable mask, to form the circles 702 (700).

Figure 8:
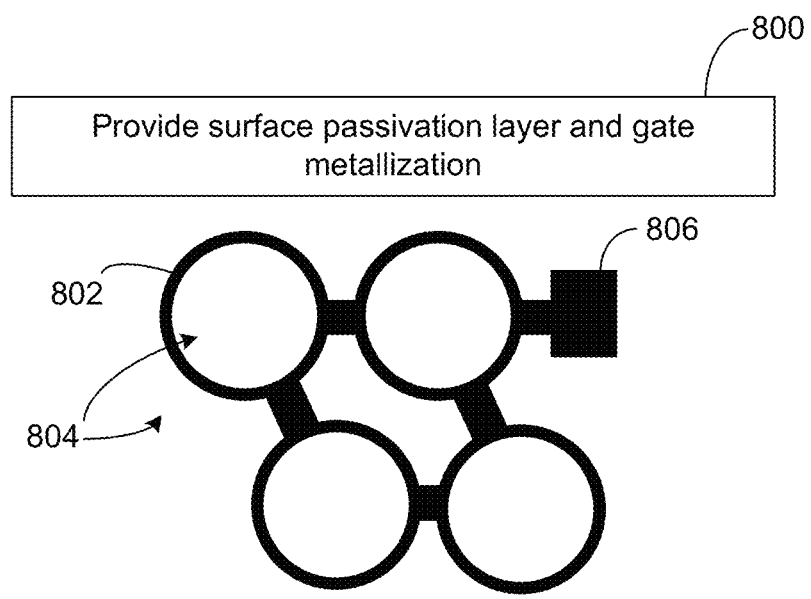
FIG. 8 is a top view of a second example process step for making the HEMT device of FIG. 1.

FIG. 8 is a top view of a second example process step for making the HEMT device of FIG. 1. In FIG. 8, a surface passivation layer(s) 804 may be provided within and around the pGan circles 702, and the pGan circles 702 may be covered by gate metallization 802, as well as the addition of gate pad 806 (800).

In more detail, for example, an atomic layer deposition (ALD) layer may be provided, e.g., a layer of $Al_2O_3$ several nanometers thick (e.g., 1-10 nm), followed by a dielectric layer such as, for example, SiN or $SiO_2$ (e.g., 50-500 nm thick) or other suitable dielectric. A contact opening for the pGan circles 702 may then be provided, followed by deposition of the gate metallization circles 802 and gate pad 804. As may be appreciated from the examples of FIGS. 1-6, the gate metallization may include desired gate field plates.

Figure 9:
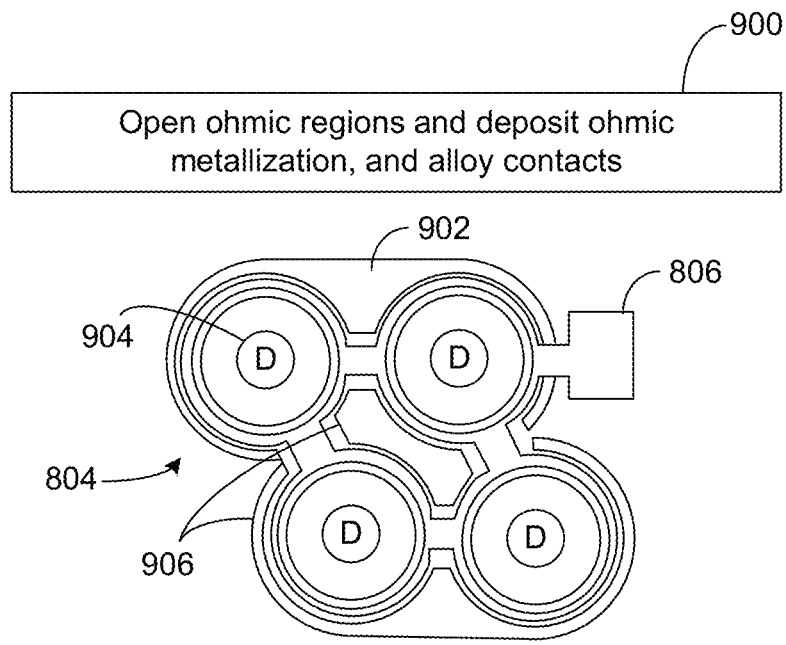
FIG. 9 is a top view of a third example process step for making the HEMT device of FIG. 1.

FIG. 9 is a top view of a third example process step for making the HEMT device of FIG. 1. In FIG. 9, open Ohmic regions and deposit Ohmic metallization 902, and alloy contacts (900). As shown, the Ohmic metallization 902 includes Ohmic drain contacts 904 and Ohmic source contacts 906.

In more detail, the Ohmic regions are opened by removing corresponding portions of the previously-described dielectric layer(s) to enable Ohmic contacts to the underlying barrier layer (e.g., the barrier layer 203 of FIGS. 2-6). By providing the Ohmic metallization 902 as shown, including within any empty voids between and around the gate metal circles 802, it is possible to enhance and optimize heat extraction for the resulting HEMT device(s), as the Ohmic metal provides a heat extraction path(s).

Figure 10:
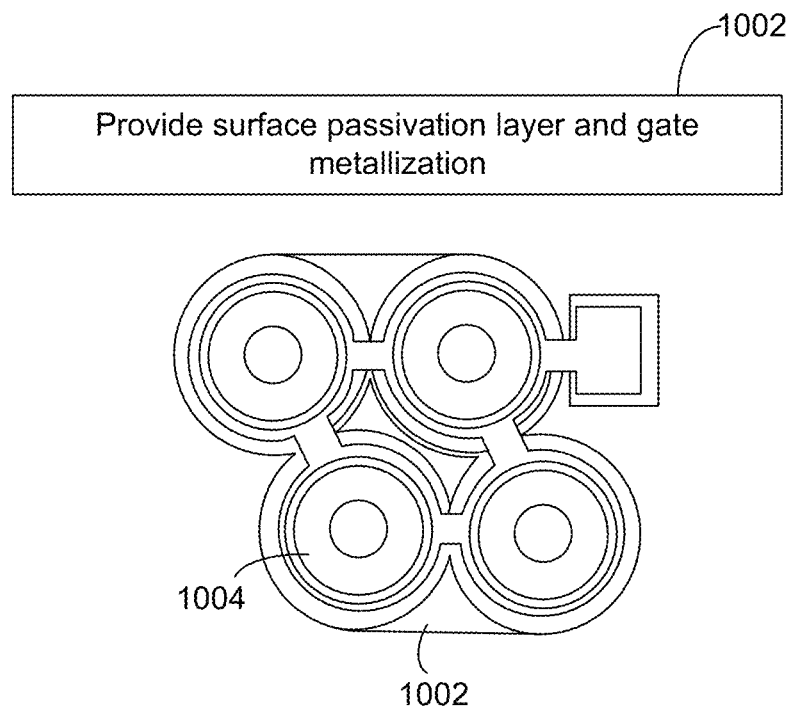
FIG. 10 is a top view of a fourth example process step for making the HEMT device of FIG. 1.

FIG. 10 is a top view of a fourth example process step for making the HEMT device of FIG. 1. In FIG. 10, a dielectric layer 1004 is formed, together with a first layer of metallization 1002 following the Ohmic contact formation (referred to herein as M1) and associated via connections for source and drain contacts (1000).

The metallization layer M1 1002 may include desired field plate structures, examples of which are illustrated in FIGS. 2-6. The dielectric layer 1004 may be deposited at a suitable thickness to withstand voltages that may occur between the M1 layer 1002 at the source and the gate metal, e.g., for voltages of up to 10V, dielectric on the order of 300 nm or less may be used.

Figure 11:
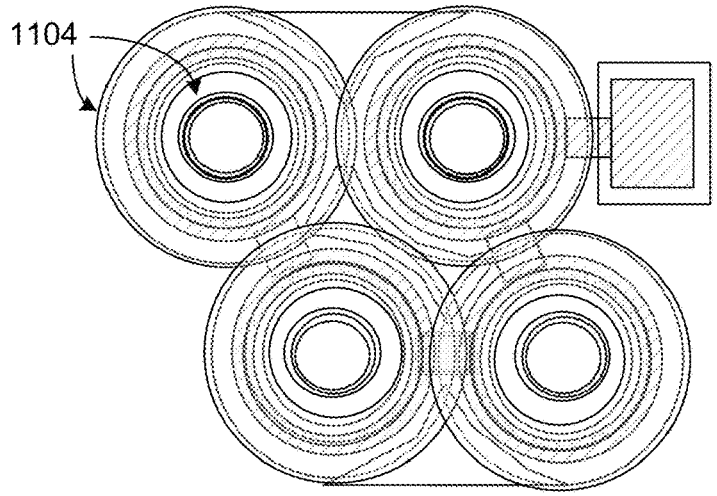
FIG. 11 is a top view of a fifth example process step for making the HEMT device of FIG. 1.

FIG. 11 is a top view of a fifth example process step for making the HEMT device of FIG. 1. In FIG. 11, a further inter-metal dielectric (IMD) layer 1104 is formed, along with a second metallization layer (M2) 1102 and associated via connections (not visible in FIG. 11) (1100). Desired field plates may also be formed.

Figure 12:
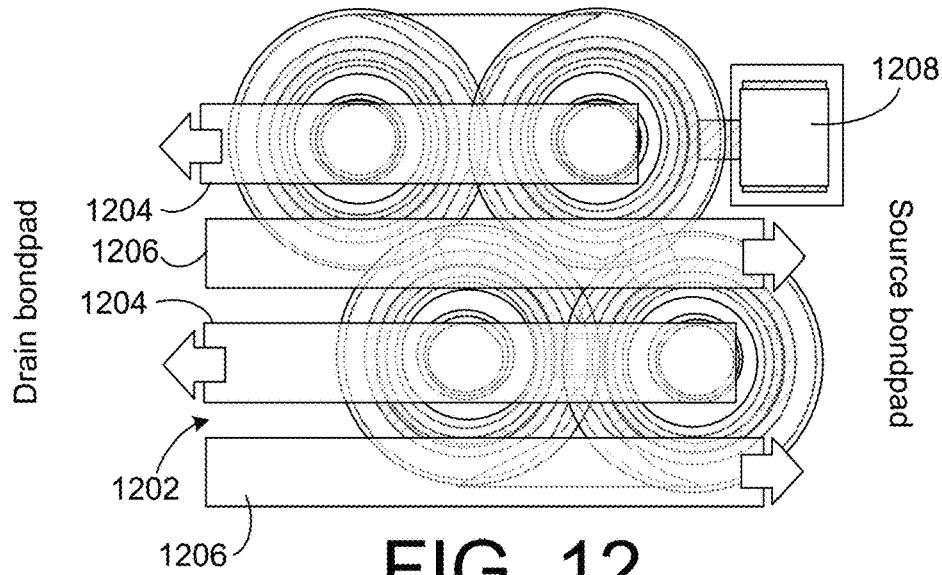
FIG. 12 is a top view of a sixth example process step for making the HEMT device of FIG. 1.

FIG. 12 is a top view of a sixth example process step for making the HEMT device of FIG. 1. In FIG. 12, an additional IMD layer 1202 may be formed, along with drain runners 1204, source runners 1206, and gate contact 1208 (1200).

A thickness of the IMD layer 1202 may be determined based on expected voltages on voltage lines that will be cross the IMD layer 1202. For example, the IMD layer 1202 may have a thickness of up to 1 micron, or more.

Not separately illustrated in the top view of FIG. 12, but visible in the example of FIGS. 1-6, a final IMD layer (e.g., layer 220 in FIG. 2) may be formed, and a drain bondpad (e.g., 122 in FIG. 1), source bondpad (e.g., 148 in FIG. 1), gate bondpad (e.g., 141 in FIG. 1), and associated via connections may be formed, as well (1201). The final IMD layer may be formed to a thickness needed to cross high voltage lines (e.g., 650V or more), where such thickness may be, e.g., at least one micron.

Figure 13:
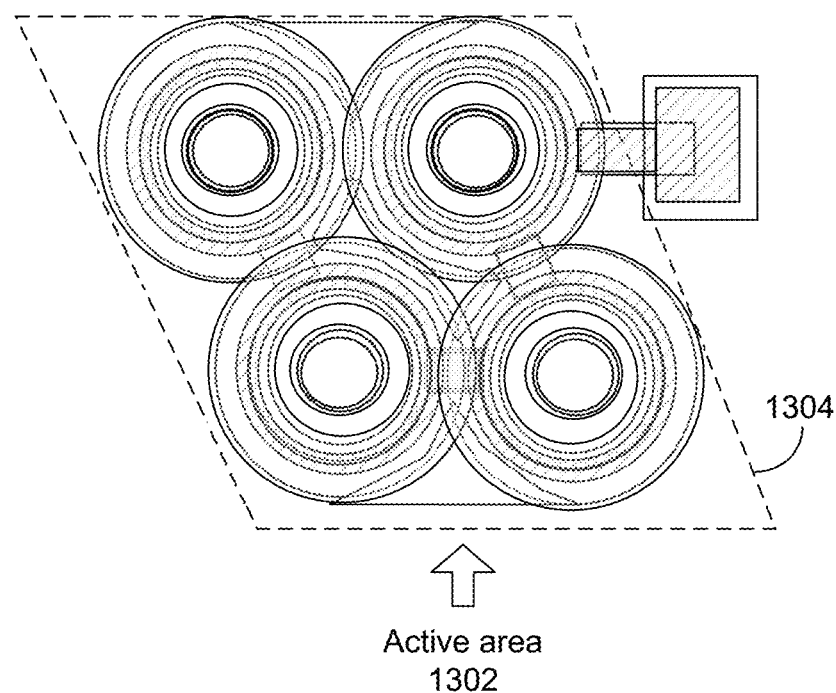
FIG. 13 is a top view of a first alternate example implementation of the HEMT device of FIG. 1.
Figure 14:
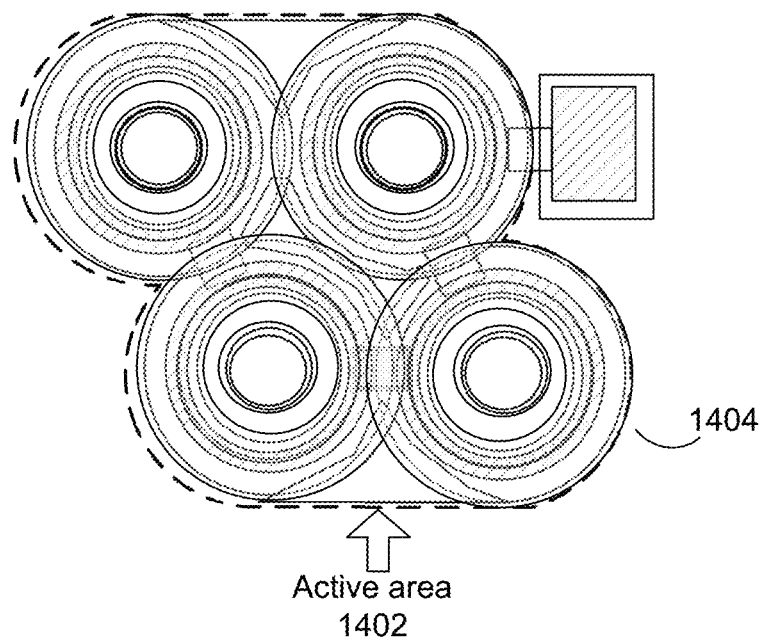
FIG. 14 is a top view of a second alternate example implementation of the HEMT device of FIG. 1.
Figure 15:
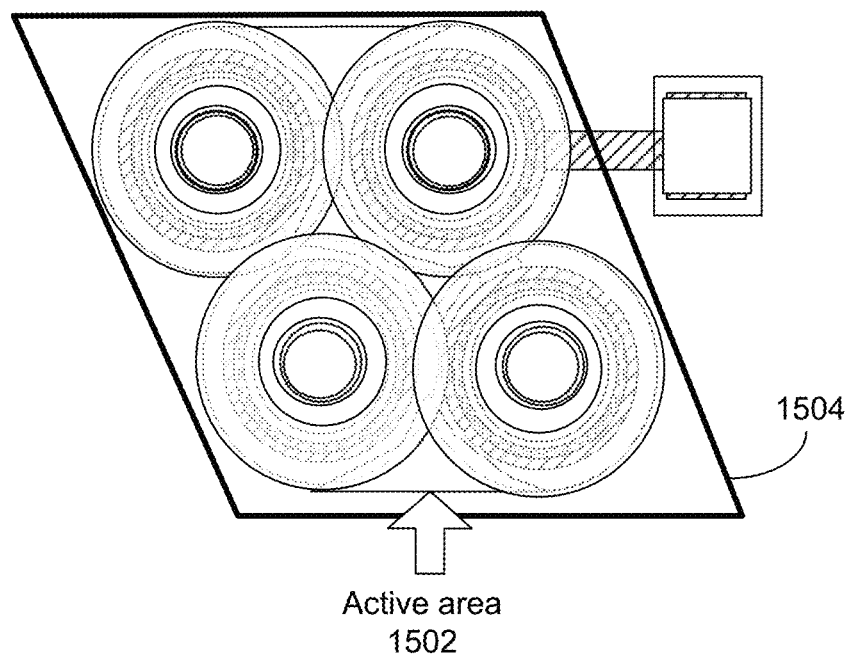
FIG. 15 is a top view of a third alternate example implementation of the HEMT device of FIG. 1.

FIG. 13 is a top view of a first alternate example implementation of the HEMT device of FIG. 1. FIG. 14 is a top view of a second alternate example implementation of the HEMT device of FIG. 1. FIG. 15 is a top view of a third alternate example implementation of the HEMT device of FIG. 1.

With respect to FIGS. 13-15, and as referenced above, many existing HEMT devices use an implantation (e.g., nitrogen) to provide device isolation. That is, for example, such nitrogen implantation creates and defines an inactive region, as opposed to an active region in which the HEMT device is primarily operated.

In conventional devices, however, it may occur that some portion of a pGan gate crosses the boundary between the active and inactive regions. In such cases, a crystal defect may be caused at the boundary between active and inactive, which may be caused by, or related to, nitrogen implantation through the pGan material. As a result, the pinch-off voltage of the HEMT current channel may be shifted, leading to a high source-to-drain offstate leakage current through the HEMT channel, particularly in the presence of a high drain voltage. An example of such a pinch-off voltage shift and associated effects is described and illustrated below, e.g., with respect to the graph of FIG. 27. Some effects may include creation of a vertical electric field that pushes carriers into a bulk of the HEMT device, which can therefore lead to carrier trapping in the buffer layer, and possibly even lead to device failure.

With the implementations of FIGS. 1-12, such implant isolation is not required, since, as referenced above, the external source configuration provides natural device isolation. Nonetheless, as shown in FIG. 13, such ion implantation may be provided as well, and without having any such implantation occurring through pGan material.

As shown in FIG. 13, for example, an active area 1302 may be defined within a border 1304 defining an external, inactive area, in which ion implantation occurs. In this way, additional device isolation may be provided, without the negative effects described above (e.g., shifted pinch-off voltage and associated offstate leakage current).

FIG. 14 provides a similar example, in which an active area 1402 is defined within a border 1404, outside of which ion implantation may occur for device isolation.

In FIG. 15, an active area 1502 is defined within a pGan border 1504. That is, the pGan border 1504 (which may include an overlaid metal, similar to the gate metal), may be connected to the source region(s) to naturally turn off (pinch off) any leakage current to a die edge. Although not separately illustrated, the pGan border 1504 may also be formed in a shape conforming to the circular perimeters of the HEMT cells, similar to the border 1404 of FIG. 14.

Figure 16:
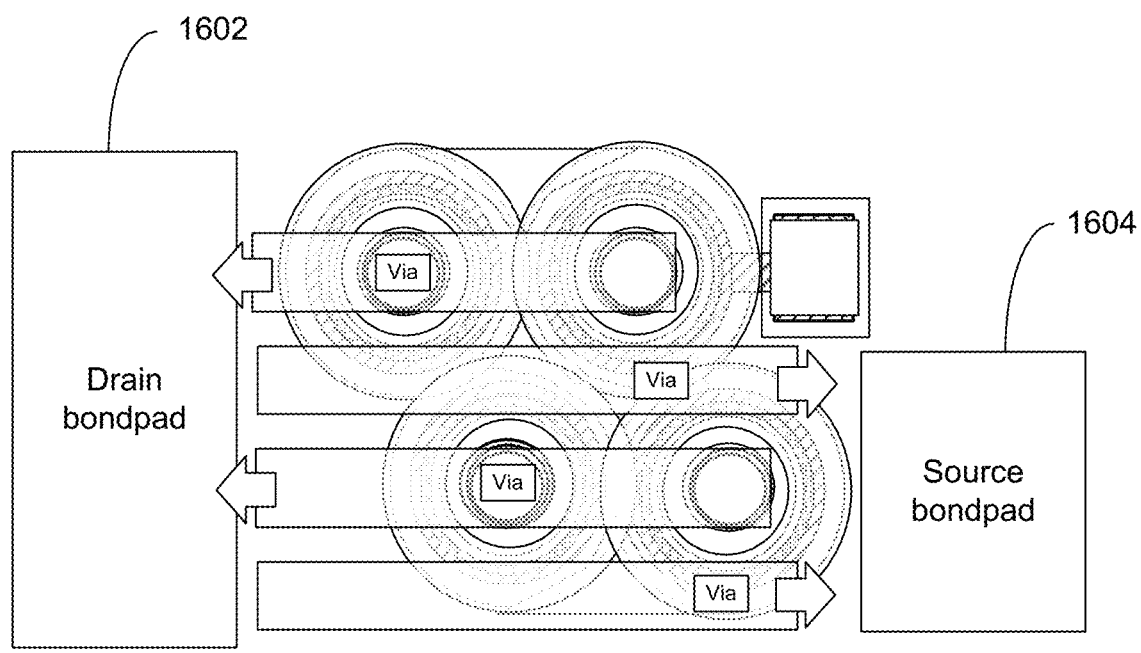
FIG. 16 is a top view of a fourth alternate example implementation of the HEMT device of FIG. 1.

FIG. 16 is a top view of a fourth alternate example implementation of the HEMT device of FIG. 1. In FIG. 16, a drain bondpad 1602 and a source bondpad 1604 are formed away from an active area of the HEMT device, in contrast the bond-on-active (BOA) implementations of FIGS. 1-12. In various implementations, the non-BOA layout of FIG. 16 may be combined with the isolation approaches of FIGS. 13-15. In other implementations, the various HEMT cells may be formed in a square format, or other closed, unbroken shape, enabled by the vertical current draw designs provided herein.

Figure 17:
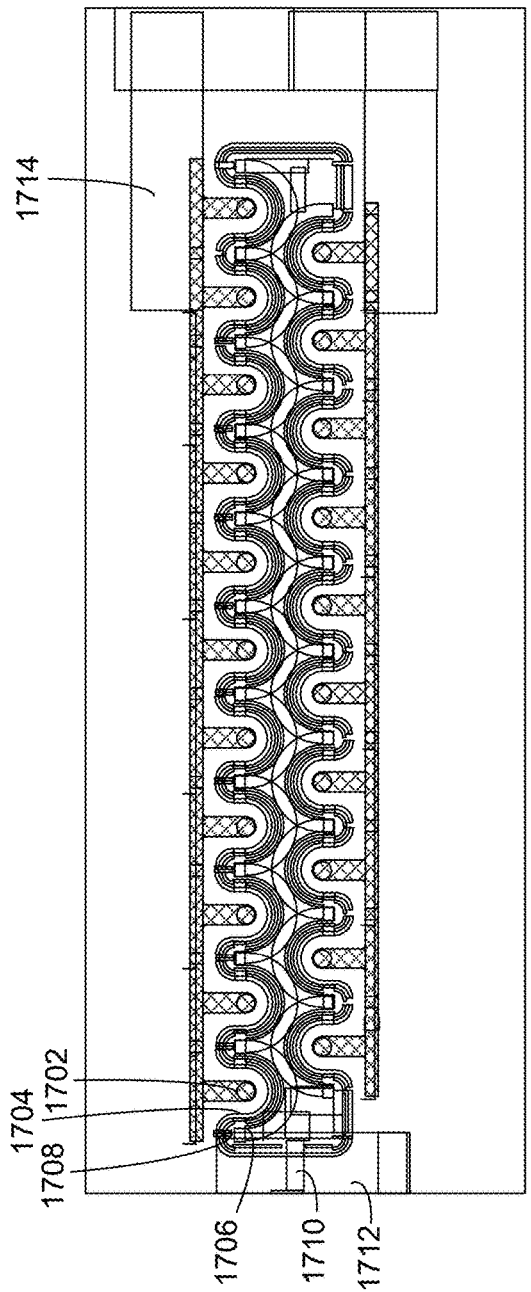
FIG. 17 is a top view of an alternate implementation of a HEMT device.
Figure 18:
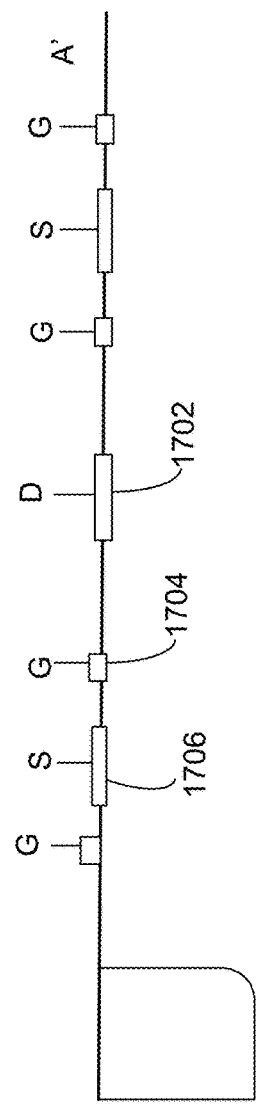
FIG. 18 is a cross-sectional view of the implementation of FIG. 17.
Figure 19:
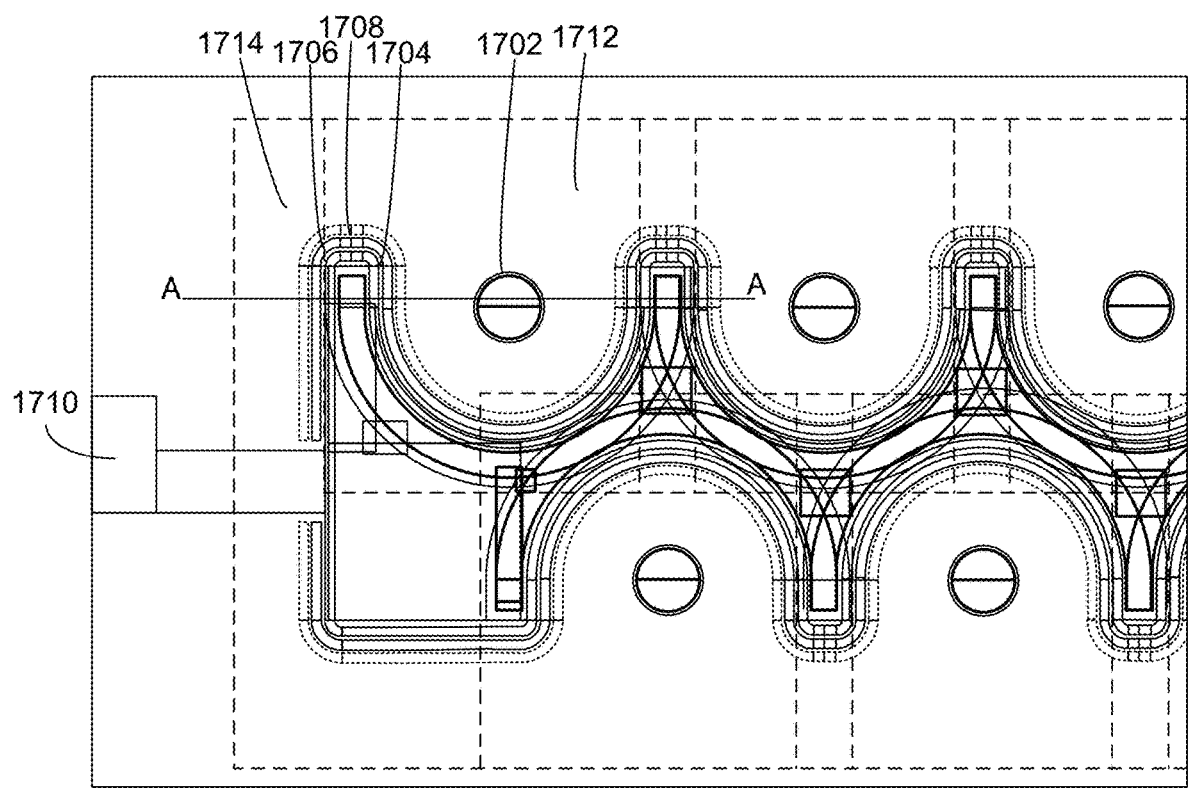
FIG. 19 is a more detailed top view of the implementation of FIG. 17.
Figure 20:
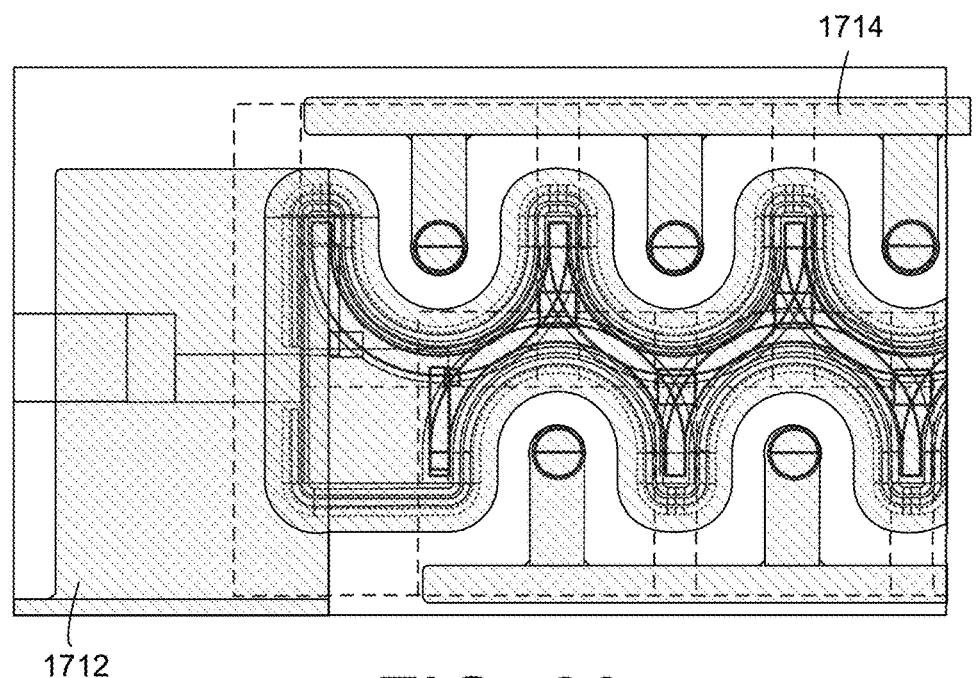
FIG. 20 is a top view of the implementation of FIG. 17, including source and drain metals.

FIG. 17 is a top view of an alternate implementation of a HEMT device. FIG. 18 is a cross-sectional view of the implementation of FIG. 17. FIG. 19 is a more detailed top view of the implementation of FIG. 17. FIG. 20 is a top view of the implementation of FIG. 17, including source and drain metals.

In FIG. 17, a drain 1702 is at a center of a half-circular gate ring 1704, which is itself inside a source 1706 having a half-circular shape. Field plates 1708 are also illustrated around the half-circular gate ring 1704.

The field plates 1708 are interrupted to access a gate metal 1710 connected to the half-circular gate ring 1704. A source metal 1712 overlays the gate metal 1710 and is connected to the source 1706. A drain metal 1714 is at a distant end of the structure of FIG. 17 from the gate metal 1710 and the source metal 1712, and is connected to the drain 1702.

The cross-section of FIG. 18, which is taken along line A-A' in FIG. 19, illustrates that a similar structure as FIG. 2 may be obtained, without requiring the three-dimensional (i.e., via-based) current draw described with respect to FIGS. 1-16.

FIG. 19 is a more detailed top view of the implementation of FIG. 17. FIG. 20 is a top view of the implementation of FIG. 17, including source and drain metals. In FIG. 19, active area 1902 is visible, which is defined relative to inactive area 1904, at which, e.g., ion implantation may occur.

Figure 21:
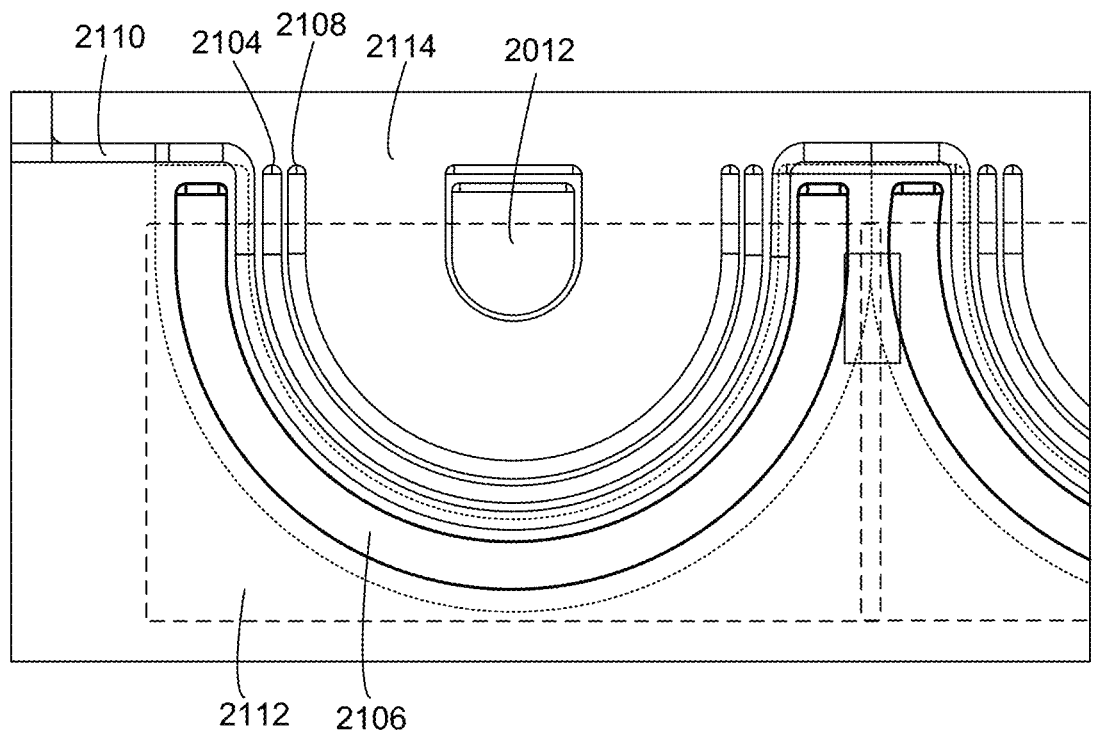
FIG. 21 is an alternate implementation of the example implementation of FIG. 17.

FIG. 21 is an alternate implementation of the example implementation of FIG. 17. Similar to FIG. 17, in FIG. 21, a drain 2102 is at a center of a half-circular gate ring 2104, which is itself inside a source 2106 having a half-circular shape. Field plates 2108 are also illustrated around the half-circular gate ring 2104. In FIG. 21, however, gate metal 2110 accesses the half-circular gate ring 2104 without breaking the field plates 2108 or the source 2106. Active area 2112 and inactive area 2114 are also illustrated.

Figure 22:
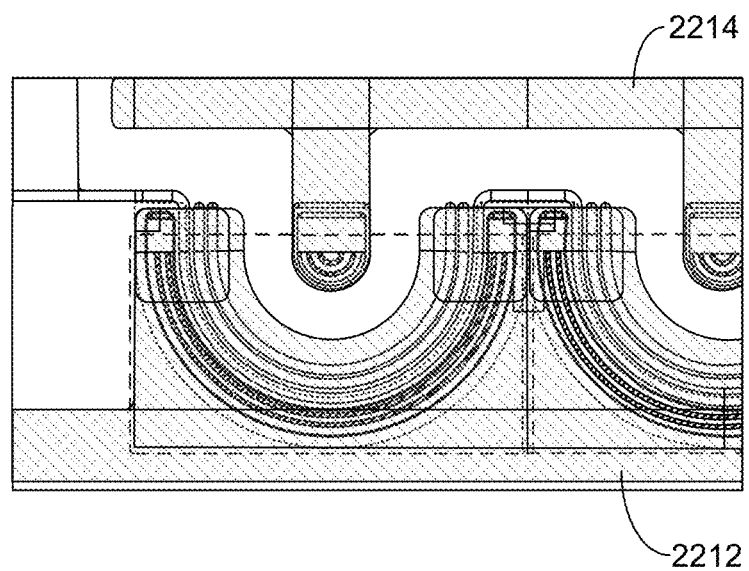
FIG. 22 is a top view of the implementation of FIG. 21, including source and drain metals.

FIG. 22 is a more detailed top view of the implementation of FIG. 21. As shown, gate metal 2110 is not overlaid by either a source metal 2212 or a drain metal 2214.

Figure 23:
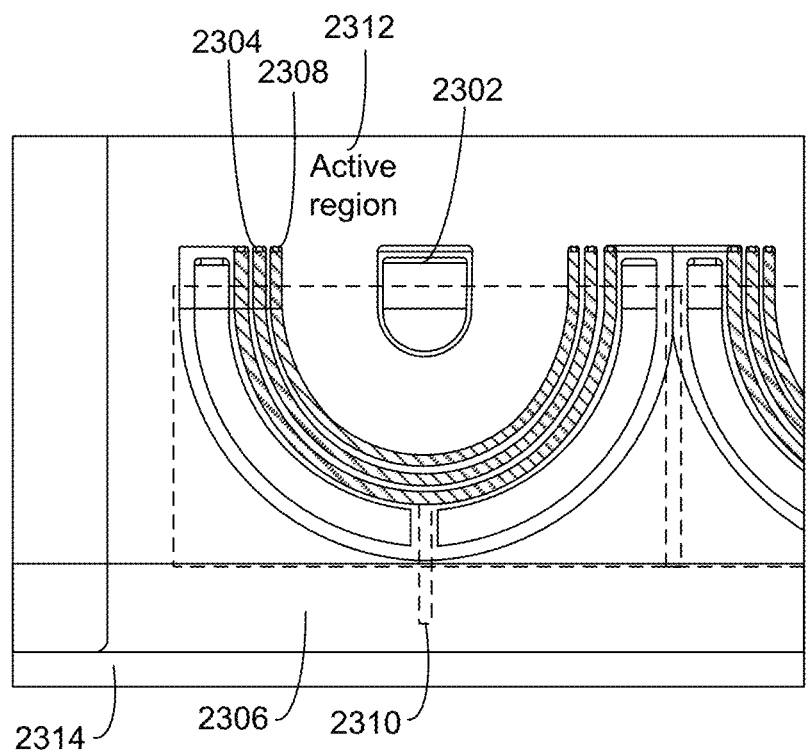
FIG. 23 is an alternate implementation of the example implementation of FIG. 17.

FIG. 23 is an alternate implementation of the example implementation of FIG. 17. Similar to FIGS. 17 and 21, in FIG. 23, a drain 2302 is at a center of a half-circular gate ring 2304, which is itself inside a source 2306 having a half-circular shape. Field plates 2308 are also illustrated around the half-circular gate ring 2304. In FIG. 23, gate metal 2310 accesses the half-circular gate ring 2104 through the source 2306. Active area 2312 and inactive area 2314 are also illustrated.

Figure 24:
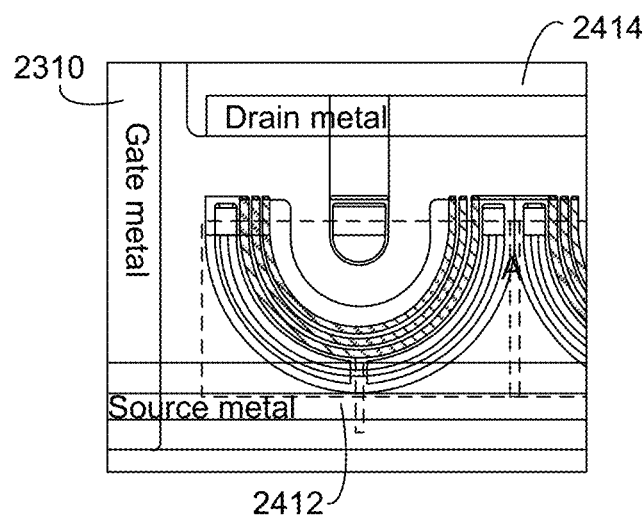
FIG. 24 is a top view of the implementation of FIG. 23, including source and drain metals.

FIG. 24 is a more detailed top view of the implementation of FIG. 23, illustrating source and drain metals. As shown, source metal 2412 overlays a portion of the gate metal 2310, while neither the source metal 2412 or the gate metal 2310 is overlaid by a drain metal 2414.

Figure 25:
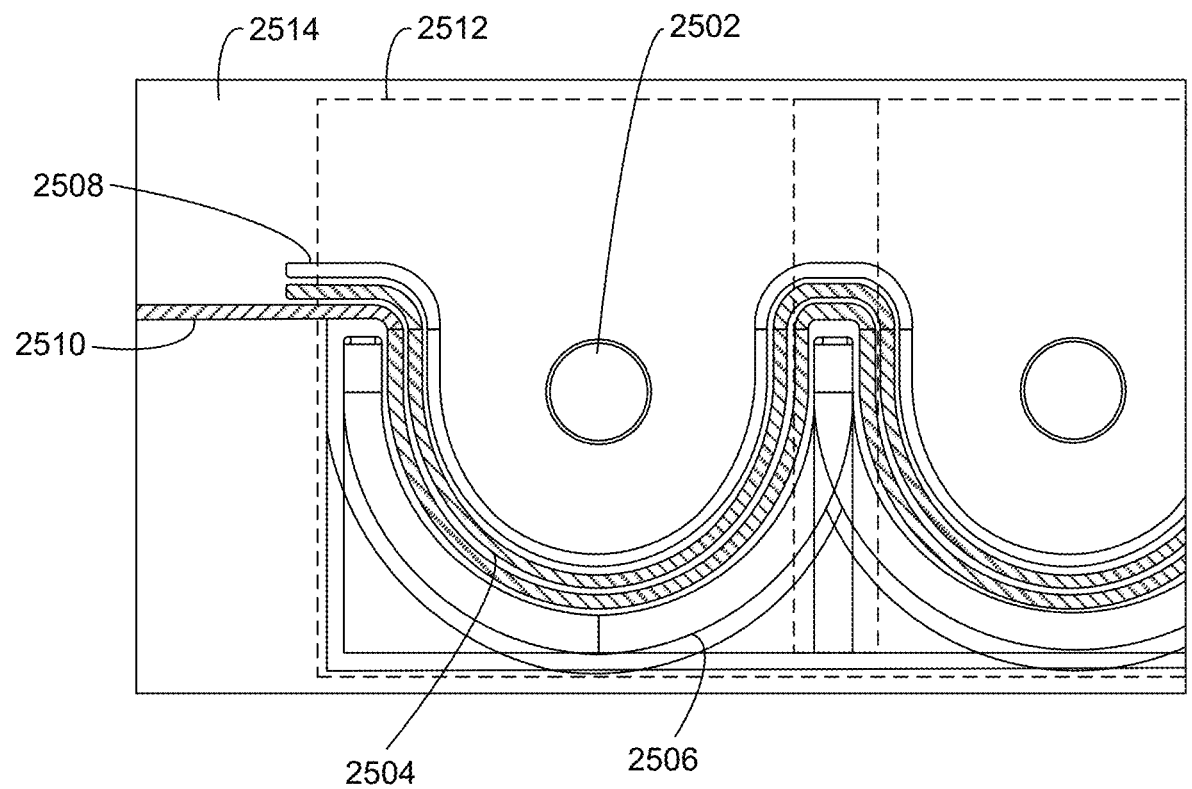
FIG. 25 is an alternate implementation of the example implementation of FIG. 17.

FIG. 25 is an alternate implementation of the example implementation of FIG. 17. Similar to FIGS. 17, 21, and 23, in FIG. 25, a drain 2502 is at a center of a half-circular gate ring 2504, which is itself inside a source 2506 having a half-circular shape. Field plates 2508 are also illustrated around the half-circular gate ring 2504. In FIG. 25, similar to FIG. 21, gate metal 2510 accesses the half-circular gate ring 2504 without breaking the field plates 2508 or the source 2506. Active area 2512 and inactive area 2514 are also illustrated.

Figure 26:
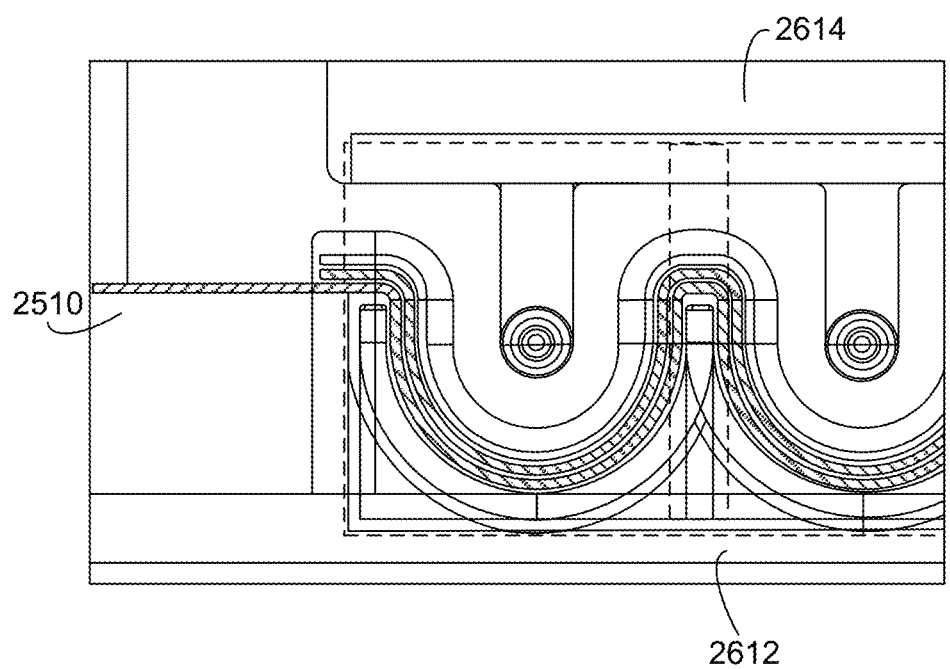
FIG. 26 is a top view of the implementation of FIG. 25, including source and drain metals.

FIG. 26 is a top view of the implementation of FIG. 24, including source and drain metals. As shown, source metal 2612 is separate from, and does not overlay, the gate metal 2510, and neither the source metal 2612 nor the gate metal 2610 is overlaid by a drain metal 2614.

Thus, FIGS. 17-26 disclose various implementations of HEMT devices with a plurality of connected, partial-circle gates, a plurality of drains, of which a drain is disposed within each the partial-circle gates, and a plurality of connected, partial-circle sources disposed along the plurality of connected, partial-circle gates. The HEMT implementations have a drain metal connecting each of the plurality of drains to one another, a gate metal connected to the plurality of connected, partial-circle gates, and a source metal connected to the plurality of connected, partial-circle sources.

The plurality of connected, partial-circle gates include a first plurality of connected, partial-circle gates opening towards a first drain metal portion of the drain metal, and a second plurality of connected, partial-circle gates opening towards a second drain metal portion of the drain metal. The plurality of connected, partial-circle sources may be disposed in between the first plurality of connected, partial-circle gates and the second plurality of connected, partial-circle gates.

In all of FIGS. 17-26, it may be appreciated that the pGan of the various gates may be prevented from crossing an active/inactive boundary. More specifically, the pGan regions are provided within and around the half-circle shapes of the various source regions, so that the various active regions are able to completely surround the HEMT structure(s). Further, as referenced above, the various field plates may be interrupted only at locations that are relatively distant from drain regions or drain metals. Thereby, associated negative effects may be avoided, as described and illustrated with respect to FIGS. 27-28, below.

Figure 27:
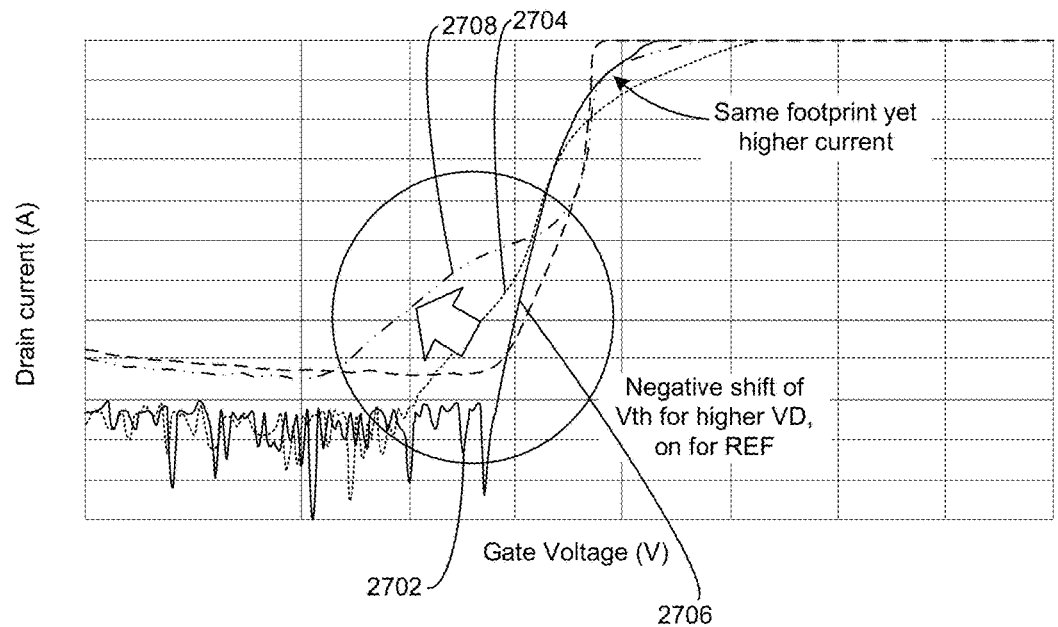
FIG. 27 is a graph illustrating improvements in current-voltage characteristics for the implementations of FIGS. 1-26.

FIG. 27 is a graph illustrating improvements in current-voltage characteristics for the implementations of FIGS. 1-26. In FIG. 27, a line 2702 corresponds to implementations described herein, e.g., the circular HEMT implementation of FIG. 1, at a first, low drain voltage (e.g., a drain voltage of a few volts, e.g., 1V). A line 2704 corresponds to the same implementation, but with a higher drain voltage on the order of hundreds of volts, e.g., at least 100V. Line 2706 and line 2708 correspond to a reference implementation with a conventional lateral HEMT structure, in which a gate and included pGan region crosses over an active/non-active boundary. Specifically, the line 2706 corresponds to the low drain voltage referenced for the line 2702, while the line 2708 corresponds to the higher drain voltage referenced for the line 2704.

As referenced above, and illustrated in FIG. 27, the reference implementation demonstrates a negative shift in threshold voltage Vth as higher drain voltages occur, as shown by the arrow between line 2706 and line 2708. However, line 2702 and line 2704 do not exhibit such a shift, indicating that an accidental turn on of the HEMT devices described herein may be avoided.

Additionally, conventional lateral HEMT devices experience a majority of channel resistance under a gate pGan region, where the current channel is off by default. It is possible to improve channel resistance by making conventional HEMT devices larger, and/or by driving such devices at relatively higher voltages. However, making such devices larger is undesirable. Moreover, driving such devices at relatively higher voltages may cause reliability issues if the driving voltages are too high and too close to breakdown voltages of the device, or if the driving voltages are too low and therefore potentially not fully on.

The implementations described herein, however, may provide lower on resistance and corresponding higher current, even when a footprint of the described implementations is the same as a corresponding footprint of a conventional device. Such increased current for a same footprint is illustrated in FIG. 27 by way of comparison between the lines 702, 704 and the lines 706, 708. Alternatively, an implementation of described circular HEMTs may have a smaller footprint with a same current as conventional lateral HEMTs, in order to prioritize space-saving.

Figure 28:
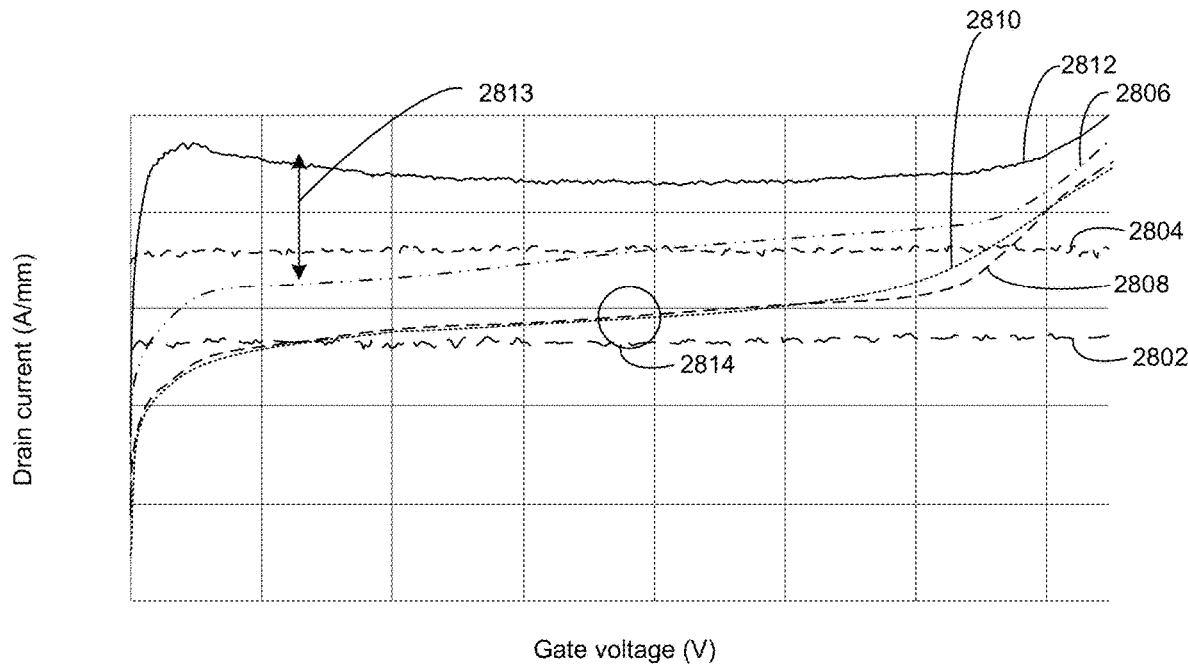
FIG. 28 is a graph illustrating additional improvements in current-voltage characteristics for the implementations of FIGS. 1-26.

FIG. 28 is a graph illustrating additional improvements in current-voltage characteristics for the implementations of FIGS. 1-26. In FIG. 28, a line 2802 corresponds to an implementation of the circular HEMTs described herein, illustrating gate leakage current (IG, off). A line 2804 corresponds to a reference device, and also illustrates a gate leakage current. A line 2806 corresponds to vertical leakage current between a substrate and a drain (Vertical ID, off) of the reference device.

A line 2808 corresponds to the implementation of the circular HEMTs of the line 2802, illustrating a drain leakage current (ID, off). A line 2810 corresponds to the reference device, and also illustrates a drain leakage current. A line 2812 corresponds to vertical leakage current between a substrate and a drain (Vertical ID, off) of the circular HEMT implementation of lines 2802, 2808.

Then, a difference between line 2810 and line 2804 indicates a source leakage current (the difference labelled as 2813), while a corresponding difference between line 2808 and 2802 indicates that the source leakage of the circular HEMT implementations is substantially eliminated (as illustrated within circle 2814). The line 2802 also demonstrates improved gate leakage characteristics, as compared to the line 2804, and the line 2808 demonstrates improved drain leakage characteristics, as compared to the line 2812.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combi-

What is claimed is:

1. A High Electron Mobility Transistor (HEMT) device, comprising:
   a drain;
   a circular gate around the drain;
   a second drain;
   a second circular gate around the second drain;
   a source around the circular gate and the second circular gate;
   a drain contact electrically connected to the drain with a drain via connection, and to the second drain with a second drain via connection, through at least one dielectric layer;
   a source contact electrically connected to the source with a source via connection through the at least one dielectric layer; and
   a gate contact electrically connected to the circular gate and to the second circular gate with a gate via connection through the at least one dielectric layer.

2. The HEMT device of claim 1, wherein the circular gate forms a complete circle.

3. The HEMT device of claim 1, further comprising:
   the second circular gate around the second drain, the second circular gate connected to the circular gate and to a gate pad;
   a second drain contact connected to the second drain with the second drain via;
   a drain runner disposed on the at least one dielectric layer and connected to the drain contact and the second drain contact;
   a second source contact connected to the source with a second source via connection through the at least one dielectric layer; and
   a source runner disposed on the at least one dielectric layer and connected to the source contact and the second source contact.

4. The HEMT device of claim 3, further comprising:
   a drain bondpad connected with a third drain via connection to the drain runner, through at least a second dielectric layer; and
   a source bondpad connected with a third source via connection to the source runner, through at least the second dielectric layer.

5. The HEMT device of claim 3, further comprising:
   a third drain;
   a third circular gate around the third drain, the third circular gate connected to the circular gate, the second circular gate, and to the gate pad, with the source being disposed around the third circular gate;
   a third drain contact connected to the third drain with a third drain via connection through the at least one dielectric layer;
   a second drain runner disposed on the at least one dielectric layer and connected to the third drain contact;
   a third source contact connected to the source with a third source via connection through the at least one dielectric layer; and
   a second source runner disposed on the at least one dielectric layer and connected to the source contact and the third source contact.

6. The HEMT device of claim 5, further comprising:
   a drain bondpad connected to the drain runner and the second drain runner; and
   a source bondpad connected to the source runner and the second source runner.

7. The HEMT device of claim 6, wherein the drain bondpad and the source bondpad are disposed outside of an area of the source.

8. The HEMT device of claim 1, further comprising an inactive isolation region surrounding the source.

9. The HEMT device of claim 1, further comprising a pGaN border surrounding the source.

10. A High Electron Mobility Transistor (HEMT) device, comprising:
    a first drain;
    a first circular gate around the first drain;
    a second drain;
    a second circular gate around the second drain and connected to the first circular gate, and to a gate pad;
    a source around the first circular gate and the second circular gate;
    a drain runner connected to the first drain with a first drain via connection through at least one dielectric layer, and connected to the second drain with a second drain via connection through the at least one dielectric layer;
    a source runner connected to the source with a first source via connection and a second source via connection through the at least one dielectric layer; and
    a gate contact connected to the gate pad with at least one gate via connection through the at least one dielectric layer.

11. The HEMT device of claim 10, wherein the first circular gate and the second circular gate form complete circles.

12. The HEMT device of claim 10, further comprising:
    a third drain;
    a third circular gate around the third drain and connected to the first circular gate and the second circular gate;
    a fourth drain; and
    a fourth circular gate around the fourth drain and connected to the first circular gate, the second circular gate, and the third circular gate, and to the gate pad, with the source around the first circular gate, the second circular gate, the third circular gate, and the fourth circular gate.

13. The HEMT device of claim 12, further comprising:
    a second drain runner connected to the third drain with a third drain via connection through the at least one dielectric layer, and connected to the fourth drain with a fourth drain via connection through the at least one dielectric layer; and
    a second source runner connected to the source with a third source via connection and a fourth source via connection through the at least one dielectric layer.

14. The HEMT device of claim 13, further comprising:
    a drain bondpad connected with a fifth drain via connection to the first drain runner and the second drain runner, through at least a second dielectric layer; and
    a source bondpad connected with a fifth source via connection to the first source runner and the second source runner, through at least the second dielectric layer.

15. The HEMT device of claim 10, further comprising an inactive isolation region surrounding the source.

16. The HEMT device of claim 10, further comprising a pGaN border surrounding the source.

17. A High Electron Mobility Transistor (HEMT) device, comprising:
    a plurality of connected, partial-circle gates;
    a plurality of drains, of which a drain is disposed within each of the partial-circle gates;
    a plurality of connected, partial-circle sources disposed along the plurality of connected, partial-circle gates;

a drain metal connecting each of the plurality of drains to one another;

a gate metal connected to the plurality of connected, partial-circle gates; and a source metal connected to the plurality of connected, partial-circle sources.

18. The HEMT device of claim 17, wherein the plurality of connected, partial-circle gates include a first plurality of connected, partial-circle gates opening towards a first drain metal portion of the drain metal, and a second plurality of connected, partial-circle gates opening towards a second drain metal portion of the drain metal.

19. The HEMT device of claim 18, wherein the plurality of connected, partial-circle sources are disposed in between the first plurality of connected, partial-circle gates and the second plurality of connected, partial-circle gates.

20. The HEMT device of claim 17, further comprising:
at least one dielectric layer formed on the plurality of connected, partial-circle gates, the plurality of drains, and the plurality of connected, partial-circle sources;
a drain bondpad formed on the at least one dielectric layer and connected to the drain metal, and disposed above at least a first portion of the plurality of connected, partial-circle gates, the plurality of drains, and the plurality of connected, partial-circle sources; and
a source bondpad formed on the at least one dielectric layer and connected to the source metal, and disposed above at least a second portion of the plurality of connected, partial-circle gates, the plurality of drains, and the plurality of connected, partial-circle sources.

21. The HEMT device of claim 17, further comprising:
at least one dielectric layer formed on the plurality of connected, partial-circle gates, the plurality of drains, and the plurality of connected, partial-circle sources;
a drain bondpad formed on the at least one dielectric layer and connected to the drain metal, and disposed away from the plurality of connected, partial-circle gates, the plurality of drains, and the plurality of connected, partial-circle sources; and
a source bondpad formed on the at least one dielectric layer and connected to the source metal, and disposed away from the plurality of connected, partial-circle gates, the plurality of drains, and the plurality of connected, partial-circle sources.

22. A HEMT device, comprising:
a channel layer;
a barrier layer disposed on the channel layer;
a circular gate and a second circular gate disposed on the barrier layer;
a circular gate metal disposed on the circular gate and a second circular gate metal disposed on the second circular gate, the circular gate metal and the second circular gate metal formed at a distance from the barrier layer;
a drain within the circular gate and a second drain within the second circular gate; and
a source around the circular gate and the second circular gate,
wherein the circular gate metal and the second circular gate metal are electrically connected to each other at the distance from the barrier layer, and the drain and the second drain are electrically connected to each other.

23. The HEMT of claim 22, comprising:
a drain contact connected to the drain with a drain via connection through at least one dielectric layer;
a source contact connected to the source with a source via connection through the at least one dielectric layer; and
a gate contact connected to the circular gate with a gate via connection through the at least one dielectric layer.

24. The HEMT of claim 23, comprising:
the second circular gate, the second circular gate connected to a gate pad;
a second drain contact connected to the second drain with a second drain via connection through the at least one dielectric layer;
a drain runner disposed on the at least one dielectric layer and connected to the drain contact and the second drain contact;
a second source contact connected to the source with a second source via connection through the at least one dielectric layer; and
a source runner disposed on the at least one dielectric layer and connected to the source contact and the second source contact.

25. The HEMT of claim 24, comprising:
a third drain;
a third circular gate around the third drain, the third circular gate connected to the circular gate, the second circular gate, and to the gate pad, with the source being disposed around the third circular gate;
a third drain contact connected to the third drain with a third drain via connection through the at least one dielectric layer;
a second drain runner disposed on the at least one dielectric layer and connected to the third drain contact;
a third source contact connected to the source with a third source via connection through the at least one dielectric layer; and
a second source runner disposed on the at least one dielectric layer and connected to the source contact and the third source contact.

\* \* \* \* \*